United States Patent [19]

Barbee et al.

[11] Patent Number: 4,717,596

[45] Date of Patent: Jan. 5, 1988

[54] METHOD FOR VACUUM VAPOR DEPOSITION WITH IMPROVED MASS FLOW CONTROL

[75] Inventors: Steven G. Barbee, Dover Plains; Gregory P. Devine, Poughquag; William J. Patrick, Newburgh; Gerard Seeley, Wappingers Falls, all of N.Y.

[73] Assignee: International Business Machines Corporation, Armonk, N.Y.

[21] Appl. No.: 915,174

[22] Filed: Oct. 3, 1986

Related U.S. Application Data

[62] Division of Ser. No. 792,729, Oct. 30, 1985, Pat. No. 4,640,221.

[51] Int. Cl.[4] .................................................. C23C 16/00
[52] U.S. Cl. ................................. 427/248.1; 118/50; 118/692; 118/715; 427/294
[58] Field of Search .................... 427/248.1, 255.1, 9, 427/255.3, 294; 118/715, 692, 689, 50

[56] References Cited

U.S. PATENT DOCUMENTS

| | | | |
|---|---|---|---|
| 3,108,014 | 10/1963 | Gellar | 118/715 |
| 3,243,314 | 5/1966 | Lehman et al. | 427/85 |
| 3,348,984 | 10/1967 | Pammer | 427/255.1 |
| 3,419,487 | 12/1968 | Robbins et al. | 427/38 |
| 3,556,841 | 1/1971 | Iwasa et al. | 427/255.3 |
| 3,808,035 | 4/1974 | Stelter | 427/255.1 |
| 3,930,908 | 1/1976 | Jolly | 118/715 |
| 3,934,060 | 1/1976 | Burt et al. | 427/248.1 |
| 4,341,107 | 7/1982 | Blair et al. | 73/3 |
| 4,374,162 | 2/1983 | Takagi | 427/248.1 |
| 4,393,013 | 7/1983 | McMenamin | 261/64 B |
| 4,436,674 | 3/1984 | McMenamin | 261/64 B |
| 4,440,618 | 4/1984 | Suzuki | 118/715 |
| 4,517,220 | 5/1985 | Rose | 118/715 |
| 4,612,206 | 9/1986 | Shimozato et al. | 118/692 |

OTHER PUBLICATIONS

A. J. Perrault et al., "Coating Process," IBM Technical Disclosure Bulletin, vol. 16, No. 3, Aug. 1973, pp. 726–727.

Application Note, "Selection of MKS Flow Elements for Flow Measurements and Control," MKS Instruments, Inc., Jan. 1980.

MKD Product Spec., "Low Vapor Pressure Mass Flow Controller", Sep. 1984.

Primary Examiner—Sadie L. Childs
Attorney, Agent, or Firm—Graham S. Jones, II

[57] ABSTRACT

A method for forming a uniform layer of a material from a vapor phase onto the surface of an object at a high rate of deposition includes a heated reservoir for vaporizing the material to be deposited, a reactor containing the objects to be coated, and a vacuum device for flowing the gaseous material from the reservoir to the reactor. The mass flow rate of the gas from the reservoir is held constant by precisely controlling the pressure at the outlet of the reservoir and at the inlet of the reactor. In one embodiment the upstream pressure is controlled by a valve responsive to a pressure sensor at the reservoir outlet, and the downstream pressure is controlled by adjusting the vacuum in the reactor as measured by a pressure sensor at the reactor inlet. A vacuum bypass line around the reactor is provided to stabilize the upstream pressure prior to admitting the gas to the reactor when a deposition cycle is commenced, and the connection between the reservoir and the reactor, and the flow control valves and pressure sensors in the flow path are maintained at a temperature sufficient to prevent condensation of the vapor downstream of the reservoir.

7 Claims, 1 Drawing Figure

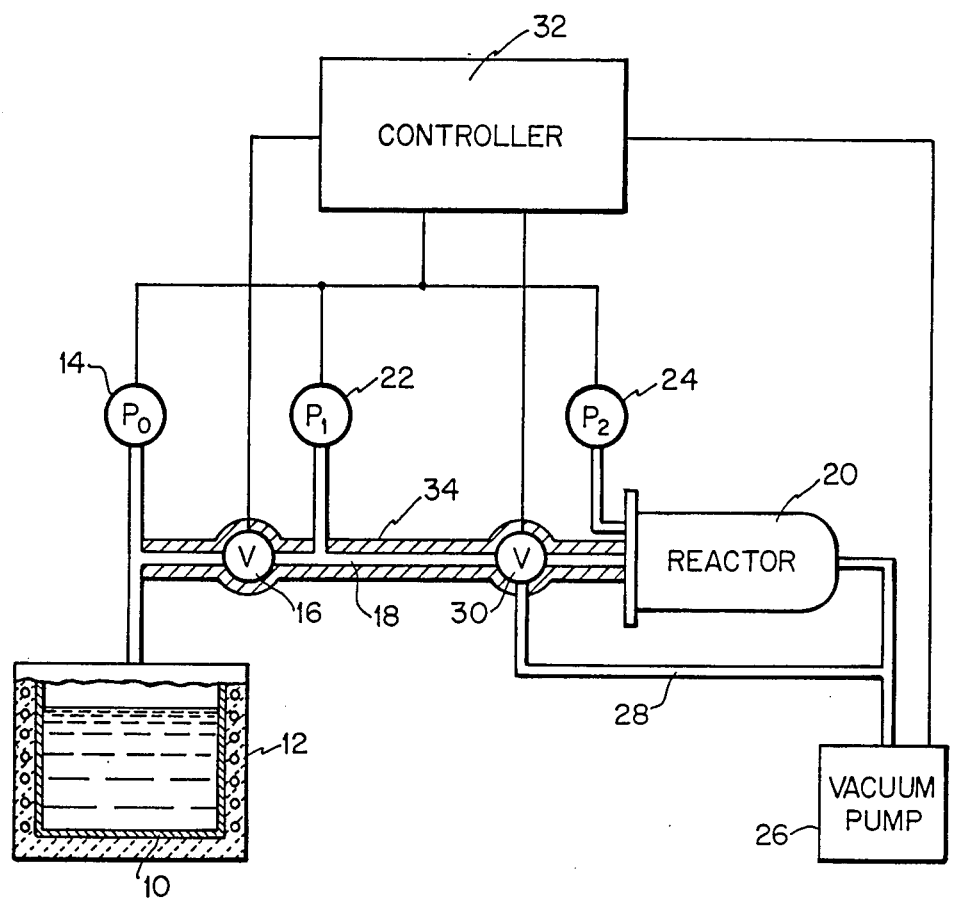

METHOD FOR VACUUM VAPOR DEPOSITION WITH IMPROVED MASS FLOW CONTROL

This is a divisional application of copending application Ser. No. 792,729, filed on Oct. 30, 1985, of S. G. Barbee et al. for "Vacuum Deposition System with Improved Mass Flow Control", now U.S. Pat. No. 4,640,221.

BACKGROUND OF THE INVENTION

The present invention relates generally to vacuum deposition systems and more particularly to a chemical vapor deposition method used in the fabrication of integrated circuit devices.

It is well known in fabricating integrated circuit devices to employ vapor phase chemical processes to form layers of various materials on a substrate. For example, one method of forming silicon dioxide on a substrate is a chemical vapor deposition process involving the pyrolysis of tetraethylorthosilicate (TEOS). The TEOS is typically vaporized in a heated reservoir and the vapor is transported to a reaction chamber, which contains the substrates, by an inert carrier gas. This method is disclosed, for example, in U.S. Pat. Nos. 3,243,314 to Lehman et al., assigned to the assignee of the present invention, and 3,556,841 to Iwasa et al.

It is important to precisely control the rate of pyrolysis of TEOS in the reaction chamber in order to form a silicon dioxide layer having the desired thickness, uniformity and chemical and electrical characteristics. This, in turn, requires a controlled mass flow or transfer of TEOS from the reservoir to the reaction chamber. In one known method for metering the mass flow rate the temperature of the reservoir containing the liquid to be vaporized is adjusted to provide a constant flux of vapor. Another method, disclosed in U.S. Pat. Nos. 4,393,013 and 4,436,674 to McMenamin, controls the rate that a carrier gas is bubbled through the reservoir to provide a constant flow rate of vaporized fluid, based upon the difference between the actual pressure in the reservoir and a reference pressure.

The system described in U.S. Pat. No. 4,341,107 to Blair et al. employs thermal conductivity type mass flow sensors at the inlet and outlet of a reservoir. The sensor measurements are compared to provide a signal, representing the mass flow rate of the vaporized liquid, which is used to control the flow rate of the carrier gas into the reservoir.

A reduced pressure chemical vapor deposition system is disclosed in U.S. Pat. No. 3,934,060 to Burt et al. This system uses a vacuum to pull the vaporized source material from a reservoir to a reactor. A predeposition vacuum process is employed to remove impurities first from the TEOS source and then from the wafer carrier and wafers in the diffusion tube or reactor.

Systems which adjust the temperature of the reservoir to control the mass flow rate of the vapor to the reactor have an inherently slow response time and thus are prone to wide variations in the thickness and uniformity of the deposited film. In other systems the reservoir geometry and liquid level are critical, and the effects of variations in bubble size are difficult to control in carrier gas type systems. In addition, it is desirable to increase the flow rate and pressure to provide a higher deposition rate while maintaining repeatability from batch to batch and uniformity in thickness and density of the deposited material.

SUMMARY OF THE INVENTION

The present invention provides a method for forming a uniform layer of a material from a vapor phase onto the surface of an object at a high rate of deposition. The material to be deposited is vaporized in a heated reservoir which is connected to a reactor containing the objects to be coated, and the gaseous material is flowed from the reservoir by a vacuum in the reactor. According to one embodiment of the invention the mass flow rate of the gas from the reservoir is held constant by precisely controlling the pressure at the outlet of the reservoir and at the inlet of the reactor. The upstream pressure is controlled by a valve responsive to a pressure sensor at the reservoir outlet, and the downstream pressure is controlled by adjusting the vacuum in the reactor as measured by a pressure sensor at the reactor inlet.

In another embodiment a vacuum bypass line around the reactor is provided to stablize the upstream pressure prior to admitting the gas to the reactor when a deposition cycle is commenced.

According to another aspect of the invention the connection between the reservoir and the reactor, and the flow control valves and pressure sensors in the flow path are maintained at a temperature higher than that of the reservoir to prevent condensation of the vapor downstream of the reservoir.

It is therefore an object of the present invention to provide a vapor deposition method for forming a uniform layer of a material upon a surface at a high deposition rate.

Another object of the present invention is to provide a means for precisely controlling the mass flow rate of a heated vapor in a vacuum system.

Still another object of the present invention is to provide a vacuum deposition method wherein the vapor mass flow rate is held constant by controlling the pressure near the vapor source and near the vapor using system.

BRIEF DESCRIPTION OF THE DRAWING

Other objects and many of the attendant advantages of the present invention will be better understood by reference to the following detailed description in conjunction with the accompanying drawing, which is a schematic diagrammatic view of a vacuum vapor deposition system according to one embodiment of the present invention.

DETAILED DESCRIPTION OF THE PREFERRED EMBODIMENT

Referring now to the drawing FIGURE, there is shown a reduced pressure vapor deposition system in accordance with the principles of the present invention. A reservoir 10 containing a liquid or solid to be vaporized is heated, for example, by a resistance heater 12. The reservoir temperature may be maintained at a desired setpoint by a conventional temperature controller (not shown). A pressure sensor 14 at the reservoir outlet provides a signal corresponding to the reservoir pressure. An adjustable valve 16 downstream of reservoir 10 meters the flow of gas into a vacuum line 18 which connects reservoir 10 to a reduced pressure reactor 20, into which the objects to be coated are placed. The pressure at the reservoir end of line 18 is monitored by a pressure sensor 22 immediately downstream of valve 16, and the pressure at the reactor end of line 18 is monitored by a pressure sensor 24 at the inlet of reactor 20. A vacuum pump 26 connected to the outlet of reactor 20 creates a vacuum in the reactor which causes gas to flow therein from reservoir 10 through line 18. A vacuum line 28 between a second adjustable valve 30 at the reactor 20 inlet and vacuum pump 26 provides a means for bypassing reactor 20 to stabilize the pressure in line 18 at the commencement of a deposition cycle.

In the preferred embodiment the system is operated automatically by a controller 32 which monitors a signal from pressure sensor 22 and operates valve 16 in response thereto to maintain the upstream end of line 18 at a constant pressure $P_1$. The downstream end of line 18 is maintained at a constant pressure $P_2$ by adjusting the speed of vacuum pump 26 in response to a signal from pressure sensor 24. Alternatively, a butterfly valve or other means upstream of pump 26 may be employed. Bypass valve 30 may be operated manually or by controller 32, and the reservoir 10 pressure signal from sensor 14 may be used to control heater 12.

Heating means such as a water jacket 34 maintains the temperature of line 18 and valves 22, 24 above that of reservoir 10 to prevent the gas from condensing as it flows to reactor 20.

In operation, the liquid or solid material in reservoir 10 is heated so that its vapor pressure, as indicated by sensor 14, is above a minimum value so that it acts as an overadequate source, while reactor 20 acts as a sink. As described above, controller 20 can be configured to control the heating of reservoir 10, the operation of valve 16 to maintain the upstream pressure at $P_1$, the adjustment of vacuum pump 26 to maintain the downstream pressure at $P_2$, and the operation of bypass valve 30 to prevent a sudden burst of vapor into reactor 20 at the commencement of a deposition cycle. Since reservoir 10 is operated as an overadequate source, the control of its temperature is not critical as in prior systems. This permits the use of pressure as the parameter for controlling the vapor mass transfer into reactor 20. The fast response time of the pressure sensors coupled with an electronic or programmable controller allows the present system to maintain substantially a constant vapor mass flow rate.

The relationship of the pressures in a flow channel to the molecular current or quantity, Q, of vapor flowing past a point in a viscous system is:

$$Q = C \times P_{ave} \times P_{diff}$$

where

C = a constant related to the length and cross-section of the flow channel and the vapor viscosity
$P_{ave}$ = the average pressure in the flow channel or $(P_1 + P_2)/2$
$P_1$ = the upstream pressure of the flow channel
$P_2$ = the pressure at the downstream end of the flow channel
$P_{diff}$ = the pressure drop along the length of the flow channel or $(P_1 - P_2)$ From this equation it can be seen that for a constant vapor viscosity and flow channel dimensions, the mass flow Q will be constant if $P_{ave}$ and $P_{diff}$ are constant, i.e., if $P_1$ and $P_2$ are constant. $P_1$ and $P_2$ correspond to the upstream and downstream pressures in line 18 in the present system. The value range of $P_{diff}$ can be varied by changing the length and cross-section of vacuum line 18.

As an illustrative example, a system according to the principles of the present invention was constructed for the low pressure chemical vapor deposition of silicon dioxide by the pyrolysis of TEOS. Reservoir 10 was a conventional quartz bubbler with an integral temperature control unit available, for example, from the Schumacher Co. Reactor 20 was a Crystal Specialties, Inc. low pressure chemical vapor deposition reactor, an line 18 was made of ¼ in. stainless steel tubing approximately two feet long. Pressure sensor 14 was a 0-100 Torr and sensors 22 and 24 were 0-10 Torr capacitance manometers available, for example, from Vacuum General Corp. or MKS Instruments, Inc., and valves 16 and 30 were conventional electrically operated valves available from Vacuum General Corp. Controller 32 was a Tylan Corp. "Tycom" model programmable process control unit. Vacuum control was effected by a Roots pump speed adjustment.

With a reservoir 10 pressure, $P_0$, of about 8 Torr and line 18 pressures of approximately $P_1 = 2.3$ Torr and $P_2 = 1$ Torr, a mass flow rate of about 200 sccm was obtained.

There has thus been provided by the present invention a system and method for the precisely controlled delivery of a heated vapor in a vacuum system, which is particularly advantageous in low pressure chemical vapor deposition systems.

While the invention has been particularly shown and described with reference to the preferred embodiment thereof, it will be understood by those skilled in the art that various changes in form and details may be made therein without departing from the spirit and scope of the invention.

What is claimed is:

1. A method of forming a layer of material upon the surface of an object, said material being deposited from a gas, said method comprising:

heating a reservoir to a temperature sufficient to vaporize a material from which said gas is formed;

creating a vacuum in a reactor containing said object to cause said gas to flow from said reservoir through an outlet from said reservoir and through said first valve and through a connecting means to said reactor; and maintaining the reservoir outlet pressure at said outlet from said reservoir at a substantially constant value by measuring said outlet pressure and adjusting said first valve to maintain said outlet pressure substantially constant and maintaining the reactor inlet pressure at a substantially constant value, thereby providing a constant mass flow rate of said gas into said reactor.

2. A method of forming a layer of material upon the surface of an object, said material being deposited from a gas, said method comprising:

heating a reservoir to a temperature sufficient to vaporize a material from which said gas is formed;

creating a vacuum in a reactor containing said object to cause said gas to flow from said reservoir containing said object first valve means to and through a connecting means to said reactor; and maintaining the outlet pressure of said reservoir at a substantially constant value by measuring said outlet pressure and maintaining adjustment of said first valve and maintaining the reactor inlet pressure at a substantially constant value, thereby providing a constant mass flow rate of said gas into said reactor from said reservoir, while maintaining said connecting means at a temperature higher than that of said reservoir.

3. A method of forming a layer of material upon the surface of an object, said material being deposited from a gas, said method comprising:

heating a reservoir to a temperature sufficient to vaporize a material from which said gas is formed;

creating a vacuum in a reactor containing said object to cause said gas to flow from said reservoir through a first valve to and through a connecting line to said reactor; and maintaining the outlet pressure of said reservoir at a substantially constant value by measuring said outlet pressure and maintaining adjustment of said first valve and maintaining the reactor inlet pressure at a substantially constant value, thereby providing a constant mass flow rate of said gas into said reactor from said reservoir, and bypassing said gas around said reactor until the pressure at the reservoir end of said connecting line means is stabilized.

4. The method of claim 1 wherein said reactor inlet pressure is maintained at a constant pressure by controlling the vacuum in said reactor.

5. A method of forming a layer of deposited material upon the surface of an object, said material being deposited from a gas by low pressure chemical vapor deposition, said method comprising:

heating a reservoir to a temperature sufficient to vaporize a source material from which said gas is formed;

employing a vacuum pump to create a vacuum in a reactor containing said object to cause said gas to flow from said reservoir through a first valve to and through a connecting means to said reactor; and maintaining the reservoir outlet pressure at a substantially constant value by measuring said outlet pressure and maintaining adjustment of said first valve, and maintaining said reactor inlet pressure at a substantially constant pressure value by controlling the vacuum in said reactor, by initially bypassing said gas around said reactor from said connecting means through a second valve and a diversion line connected between said connecting means and said vacuum pump until the pressure at the reservoir end of said connecting line means is stabilized and subsequently controlling the velocity of inlet pressure, thereby providing a constant mass flow rate of said gas into said reactor to deposit said deposited material therein by chemical vapor deposition, while simultaneously maintaining said connecting means at a temperature higher than that of said reservoir.

6. The method of claim 5 wherein the heating of said reservoir is adjusted as a function of pressure readings of a pressure gauge for said reservoir outlet pressure to maintain said pressur substantially constant.

7. The method of claim 5 wherein the pressure in said reservoir is maintained at about 8 Torr, the pressure at the upstream end of said connecting means is maintained at about 2.3 Torr, and the pressure at the downstream end of said connecting means is maintained at about 1 Torr.

* * * * *